(12) United States Patent
Ueda et al.

(10) Patent No.: US 9,099,586 B2
(45) Date of Patent: Aug. 4, 2015

(54) NITRIDE SEMICONDUCTOR LIGHT-EMITTING ELEMENT AND METHOD FOR PRODUCING NITRIDE SEMICONDUCTOR LIGHT-EMITTING ELEMENT

(71) Applicants: Masaya Ueda, Osaka (JP); Yoshihiro Ueta, Osaka (JP); Yuichi Sano, Osaka (JP); Toshiyuki Okumura, Osaka (JP)

(72) Inventors: Masaya Ueda, Osaka (JP); Yoshihiro Ueta, Osaka (JP); Yuichi Sano, Osaka (JP); Toshiyuki Okumura, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 114 days.

(21) Appl. No.: 13/680,460

(22) Filed: Nov. 19, 2012

(65) Prior Publication Data
US 2013/0134388 A1    May 30, 2013

(30) Foreign Application Priority Data
Nov. 25, 2011    (JP) .................................. 2011-257522

(51) Int. Cl.
*H01L 33/04*    (2010.01)
*H01L 33/12*    (2010.01)
*H01L 33/00*    (2010.01)

(52) U.S. Cl.
CPC ................ *H01L 33/04* (2013.01); *H01L 33/12* (2013.01); *H01L 33/0075* (2013.01)

(58) Field of Classification Search
CPC . H01L 29/2003; H01L 21/0254; H01L 33/06; H01L 33/18; H01L 33/08; H01L 21/02505; H01L 29/66462; H01L 29/66977; H01L 29/7783; H01L 31/184; H01L 31/1848; H01L 33/007; H01L 31/03044
USPC .............. 257/3, 22, E29.091, E21.09, 14, 94, 257/103, 97
See application file for complete search history.

(56) References Cited

U.S. PATENT DOCUMENTS

| | | | |
|---|---|---|---|
| 4,927,471 A | 5/1990 | Okuda | |
| 2008/0048176 A1 | 2/2008 | Orita et al. | |
| 2009/0072262 A1* | 3/2009 | Iza et al. | 257/98 |
| 2010/0187496 A1 | 7/2010 | Yan | |
| 2011/0197808 A1* | 8/2011 | Shioda et al. | 117/89 |

FOREIGN PATENT DOCUMENTS

| | | |
|---|---|---|
| JP | 01-222431 A | 9/1989 |
| JP | 06-188447 A | 7/1994 |
| JP | 2006-332365 | 12/2006 |
| JP | 2008-053602 | 3/2008 |
| JP | 2008-244360 A | 10/2008 |
| JP | 2011-155241 | 8/2011 |

* cited by examiner

*Primary Examiner* — Cathy N Lam
(74) *Attorney, Agent, or Firm* — Harness, Dickey & Pierce, P.L.C.

(57) ABSTRACT

To provide a nitride semiconductor light-emitting element in which a buffer layer provided between an n-type nitride semiconductor layer and a p-type nitride semiconductor layer has a first buffer layer expressed by an equation of $In_{x1}Ga_{1-x1}N$ ($0<x1\leq 1$) and a second buffer layer expressed by an equation of $In_{x2}Ga_{1-x2}N$ ($0\leq x2<1$, $x2<x1$) alternately laminated, an In composition $x1$ of the first buffer layer is changed, and the In composition $x1$ of at least one layer of the first buffer layers is higher than an In composition of the active layer, and a method for producing the same.

11 Claims, 8 Drawing Sheets

NITRIDE SEMICONDUCTOR LIGHT-EMITTING ELEMENT AND METHOD FOR PRODUCING NITRIDE SEMICONDUCTOR LIGHT-EMITTING ELEMENT

This nonprovisional application is based on Japanese Patent Application No. 2011-257522 filed on Nov. 25, 2011 with the Japan Patent Office, the entire contents of which are hereby incorporated by reference.

BACKGROUND OF THE INVENTION

1. Field of the Invention

The present invention relates to a nitride semiconductor light-emitting element and a method for producing a nitride semiconductor light-emitting element.

2. Description of the Background Art

AlN, GaN, and InN have bandgaps of about 6.0 eV, about 3.4 eV, and about 0.6 eV, respectively. Therefore, a nitride semiconductor light-emitting element having these mixed crystals as an active layer can emit light having a wavelength region extending from the ultraviolet to the infrared, and it is being applied to various purposes such as a light source for lighting, or a backlight of a liquid crystal display.

A nitride semiconductor light-emitting element having an InGaN-based nitride semiconductor as an active layer can emit light having a wavelength region longer than a near-ultraviolet region. However, it is known that internal quantum efficiency of the nitride semiconductor light-emitting element is lowered as a wavelength of emitted light is increased, that is, an In composition is increased. This is caused by following reasons.

Compared with a nitrogen atom having extremely small ion radius, a lattice mismatch rate between InN and GaN composed of an In atom having a relatively large ion radius and a Ga atom having an intermediate ion radius, is about 10%, and a lattice mismatch rate between InGaN and GaN is 0% (GaN) to 10% (InN), depending on an In composition of InGaN.

Due to the lattice mismatch between InGaN and GaN, a crystal growth to uniformly distribute atoms in a crystal without disturbing an order of a crystal structure is more difficult to perform in a nitride semiconductor having a high In composition. Therefore, due to a lattice constant difference between InGaN and GaN, strong strain is applied to an InGaN/GaN quantum well active layer, so that a large internal electric field caused by piezoelectric polarization is generated in the active layer. It is considered that the internal quantum efficiency of the nitride semiconductor light-emitting element is reduced due to the internal electric field generated in the active layer.

For example, Patent Document 1 (Japanese Patent Laying-Open No. 2008-244360) discloses, in order to suppress phase separation in an InGaN active layer, a nitride semiconductor light-emitting element having an active layer between an n-type layer and a p-type layer, and having an optical confinement layer including an InGaN superlattice in which lattice relaxation is not provided at each of an interface between the n-type layer and the active layer, and an interface between the active layer and the p-type layer.

In addition, Patent Document 2 (Japanese Patent Laying-Open No. 1-222431) discloses an effect of restraining propagation of dislocation by a strained superlattice in a GaAs-based semiconductor element.

Furthermore, Patent Document 3 (Japanese Patent Laying-Open No. 6-188447) discloses a rapid lattice relaxation action by an $InAs_xP_{1-x}/InAs_yP_{1-y}$ superlattice in a GaInAs photo-diode.

SUMMARY OF THE INVENTION

In a conventional InGaN/GaN quantum well active layer formed on a polar face (0001), there is an internal electric field caused by piezoelectric polarization generated under compression strain in a plane. Hereinafter, the influence of the compression strain in the plane will be described.

As described above, the lattice mismatch rate between InN and GaN is about 10%, and the lattice mismatch rate between InGaN and GaN is 0% (GaN) to 10% (InN), depending on the In composition of InGaN.

Thus, InGaN grown coherently on GaN whose main surface is (0001) face strains under the influence of the compression strain caused by the lattice mismatch with the GaN, and the piezoelectric polarization is generated in +c direction ([0001]).

The polarization in InGaN is composed of spontaneous polarization generated in −c direction and the above piezoelectric polarization, due to bonding asymmetry.

In a case where the strain is not generated in the InGaN quantum well layer, the electric field caused by the piezoelectric polarization is not generated, and only the electric field due to the spontaneous polarization which is smaller than the piezoelectric polarization by one digit has to be considered, so that its internal quantum efficiency is almost 100% when a non-radiative recombination process is ignored.

However, when InGaN (3 nm)/GaN quantum well active layer having the In composition of about 10% is grown coherently on GaN, an electric field of about 1 to 2 MV/cm caused by the piezoelectric polarization is generated in the −c direction, and this becomes dominant.

This large internal electric field spatially separates carriers in the InGaN quantum well layer, in a quantum well active layer composed of the InGaN quantum well layer and the GaN barrier layer, for example.

When an electron and a hole are spatially separated in the InGaN quantum well layer, an overlap of a wave function is reduced, and a radiative recombination lifetime is increased. For example, as for a (0001) InGaN (3 nm)/GaN quantum well active layer having an In composition of up to about 15% to provide blue light, the radiative recombination lifetime is reportedly about several n seconds. In this case, when the non-radiative recombination process is ignored, the internal quantum efficiency is about several %.

Meanwhile, as for non-radiative recombination, when a density of a defect which could become a non-radiative combination center is high, a non-radiative recombination lifetime is extremely short such as about 150 ps. In the case where the radiative recombination lifetime is about several n seconds, the non-radiative recombination process becomes dominant in a carrier recombination process, so that the injected carries are mostly subjected to the non-radiative recombination and converted to heat.

Internal quantum efficiency ηint is expressed by a following equation (i) wherein τr represents the radiative recombination lifetime, and τnr represents the non-radiative recombination.

$$\eta int = 1/(1+\tau r/\tau nr) \qquad (i)$$

Therefore, as for the (0001) InGaN (3 nm)/GaN quantum well active layer, the radiative recombination lifetime is long and the non-radiative recombination lifetime is short, so that the internal quantum efficiency is lowered to be less than or equal to several %. Then, since external quantum efficiency is expressed by a following equation (ii), the reduction in internal quantum efficiency leads to a reduction in external quantum efficiency.

(external quantum efficiency)=(internal quantum efficiency)×(light-extraction efficiency)×(injection efficiency)        (ii)

In addition, by decreasing the radiative recombination lifetime and increasing the non-radiative recombination lifetime, the internal quantum efficiency is improved.

According to the nitride semiconductor light-emitting element described in Patent Document 1, the lattice relaxation is not provided in the optical confinement layer including the InGaN superlattice, and the composition is not changed, so that an In composition of the optical confinement layer is lower than an In composition of the active layer. That is, the optical confinement layer including the InGaN superlattice and the active layer are grown coherently on the base GaN. Therefore, according to Patent Document 1, in-plane strain of InGaN is not controlled with a lattice constant in the plane of the optical confinement layer, the internal electric field caused by the piezoelectric polarization cannot be reduced in the active layer, so that the internal quantum efficiency of the active layer is not improved.

In addition, in the case where the piezoelectric polarization is extremely small like the GaAs-based semiconductor described in Patent Documents 2 and 3, even when a large strain is generated in the active layer, the internal electric field due to the piezoelectric polarization does not become problematic. Therefore, an effect of the present invention which will be described later is not provided in Patent Documents 2 and 3.

In view of the above circumstances, it is an object of the present invention to provide a nitride semiconductor light-emitting element in which internal quantum efficiency of an active layer is improved, and a method for producing the nitride semiconductor light-emitting element.

According to the present invention, a nitride semiconductor light-emitting element includes a substrate, an n-type nitride semiconductor layer and a p-type nitride semiconductor layer provided on the substrate, and a buffer layer and an active layer provided between the n-type nitride semiconductor layer and the p-type nitride semiconductor layer, in which the buffer layer has a first buffer layer expressed by an equation of $In_{x1}Ga_{1-x1}N$ ($0<x1\leq1$) and a second buffer layer expressed by an equation of $In_{x2}Ga_{1-x2}N$ ($0\leq x2<1$, $x2<x1$) alternately laminated, the buffer layer has a plurality of the first buffer layers, an In composition x1 of the first buffer layer is changed in the buffer layer, and the In composition x1 of at least one layer of the first buffer layers is higher than an In composition of the active layer.

Here, according to the nitride semiconductor light-emitting element in the present invention, it is preferable that the In composition x1 of the first buffer layer is increased continuously or in stages in the buffer layer toward the active layer, and the In composition x1 of the first buffer layer arranged closest to the active layer is higher than the In composition of the active layer.

In addition, according to the nitride semiconductor light-emitting element in the present invention, it is preferable that in the buffer layer, an In composition x2 of the second buffer layer is constant in a range satisfying that $0\leq x2<x1$, or increased under a condition that $x2<x1$ toward the active layer.

In addition, according to the nitride semiconductor light-emitting element in the present invention, it is preferable that the substrate includes $Al_xIn_yGa_{1-x-y}N$ ($0\leq x\leq1$, $0\leq y\leq1$, $0<x+y\leq1$), GaP, GaAs, $NdGaO_3$, $LiGaO_2$, $Al_2O_3$, $MgAl_2O_4$, ZnO, SiC, SiGe, or $ZrB_2$.

In addition, according to the nitride semiconductor light-emitting element in the present invention, it is preferable that a surface of the substrate is a polar face, semi-polar face, or no-polar face.

In addition, according to the nitride semiconductor light-emitting element in the present invention, it is preferable that the substrate is a heterogeneous substrate, and a defect density in the active layer is less than or equal to $1\times10^7/cm^2$.

Further, according to the present invention, a method for producing any of the above nitride semiconductor light-emitting elements, includes the steps of laminating the n-type nitride semiconductor layer on the substrate, laminating the buffer layer on the n-type nitride semiconductor layer, laminating the active layer on the buffer layer, and laminating the p-type nitride semiconductor layer on the active layer.

Furthermore, according to the present invention, a method for producing any of the above nitride semiconductor light-emitting elements includes the steps of laminating the p-type nitride semiconductor layer on the substrate, laminating the buffer layer on the p-type nitride semiconductor layer, laminating the active layer on the buffer layer, and laminating the n-type nitride semiconductor layer on the active layer.

The present invention provides the nitride semiconductor light-emitting element in which the internal quantum efficiency of the active layer is improved, and the method for producing the nitride semiconductor light-emitting element. This leads to an improvement in external quantum efficiency of the nitride semiconductor light-emitting element.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
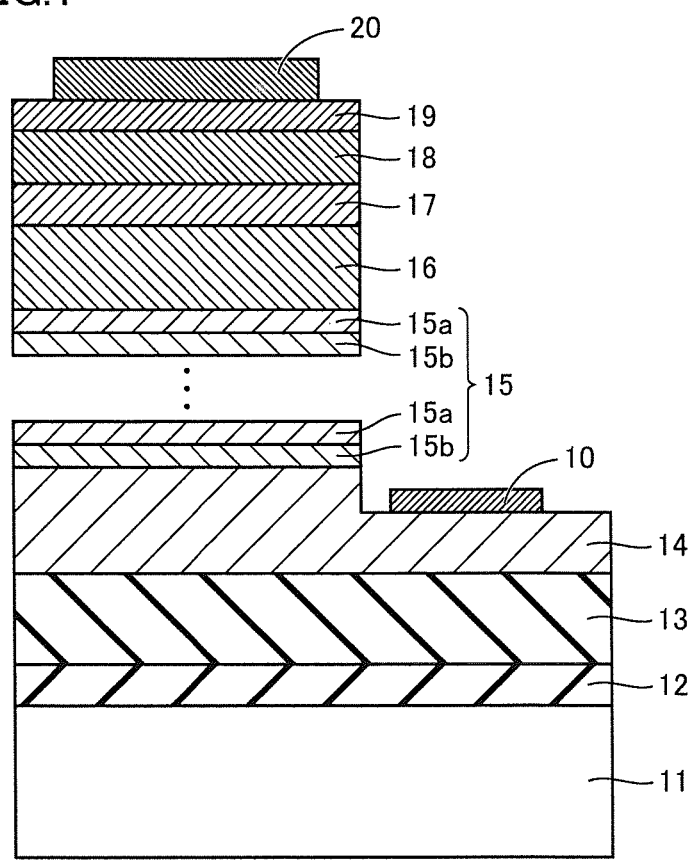
FIG. 1 is a schematic cross-sectional view of a nitride semiconductor light-emitting element in a first embodiment.

Hereinafter, embodiments of the present invention will be described. Note that, the same reference mark represents the same part or a corresponding part in the drawings of the present invention.

First Embodiment

Structure of Nitride Semiconductor Light-Emitting Element

FIG. 1 shows a schematic cross-sectional view of a nitride semiconductor light-emitting element in a first embodiment. The nitride semiconductor light-emitting element in the first embodiment includes a substrate 11, a low-temperature buffer layer 12 provided on a surface of substrate 11, an undoped GaN layer 13 provided on low-temperature buffer layer 12, an n-type GaN layer 14 provided on undoped GaN layer 13, a buffer layer 15 provided on n-type GaN layer 14, an active layer 16 provided on buffer layer 15, a carrier barrier layer 17 provided on active layer 16, a p-type GaN layer 18 provided on carrier barrier layer 17, and a p-type GaN contact layer 19 provided on p-type GaN layer 18.

In addition, an n electrode 10 is provided on a surface of n-type GaN layer 14, and a p electrode 20 is provided on a surface of p-type GaN contact layer 19.

Furthermore, buffer layer 15 includes a second buffer layer 15b expressed by an equation of $In_{x2}Ga_{1-x2}N$ ($0 \le x2 < 1$, $x2 < x1$) and a first buffer layer 15a expressed by an equation of $In_{x1}Ga_{1-x1}N$ ($0 < x1 \le 1$) alternately laminated between n-type GaN layer 14 and active layer 16. Thus, buffer layer 15 has a plurality of first buffer layers 15a and a plurality of second buffer layers 15b.

Here, an In composition x1 of first buffer layer 15a is changed in buffer layer 15, and the In composition x1 of at least one layer of first buffer layers 15a is higher than an In composition of active layer 16.

<Method for Producing Nitride Semiconductor Light-Emitting Element>

Figure 2:
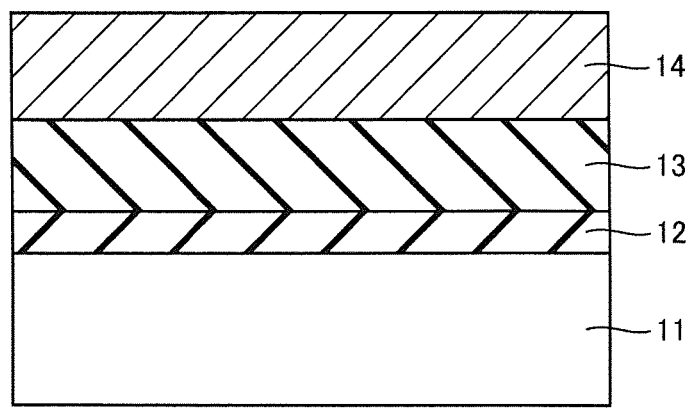
FIG. 2 is a schematic cross-sectional view illustrating a part of production steps in one example of a method for producing the nitride semiconductor light-emitting element in the first embodiment.

With reference to schematic cross-sectional views in FIGS. 2 to 6, one example of a method for producing the nitride semiconductor light-emitting element in the first embodiment will be described below. First, as shown in FIG. 2, low-temperature buffer layer 12 is formed on the surface of substrate 11, undoped GaN layer 13 is laminated on low-temperature buffer layer 12, and n-type GaN layer 14 is laminated on undoped GaN layer 13.

<<Substrate>>

For example, substrate 11 is composed of $Al_xIn_yGa_{1-x-y}N$ ($0 \le x \le 1$, $0 \le y \le 1$, $0 < x+y \le 1$), GaP, GaAs, $NdGaO_3$, $LiGaO_2$, $Al_2O_3$, $MgAl_2O_4$, ZnO, SiC, SiGe, or $ZrB_2$. In this embodiment, substrate 11 is a sapphire ($Al_2O_3$) substrate having a C face serving as a polar face as a main surface. In addition, in order to improve luminous efficiency of the nitride semiconductor light-emitting element, periodic concavity and convexity, may be provided on the surface of substrate 11. Note that, according to this embodiment, a nitride semiconductor layer is grown on the polar face of substrate 11, but the nitride semiconductor layer may be grown on a semi-polar face or a non-polar face of substrate 11.

<<Growth of Low-Temperature Buffer Layer>>

For example, low-temperature buffer layer 12 can be grown on the C face of the sapphire substrate serving as substrate 11 as follows.

First, substrate 11 is set in a reactor of an MOCVD (Metal Organic Chemical Vapor Deposition) apparatus, a hydrogen atmosphere is created in the reactor, and a temperature of substrate 11 is heated up to be greater than or equal to 1000° C. in the hydrogen atmosphere.

Here, the temperature of substrate 11 is preferably heated up to be greater than or equal to 1000° C. in 10 minutes to 20 minutes. In this case, while substrate 11 is prevented from being cracked due to thermal shock (damaged when heated up at high speed because a stress difference is generated between a front surface and a back surface of substrate 11 due to thermal expansion), the temperature of substrate 11 can be heated up efficiently. Herein, according to this embodiment, the temperature of substrate 11 is heated up to be greater than or equal to 1000° C. in 20 minutes.

In addition, when substrate 11 is heated up to be greater than or equal to 1000° C. in the reducing hydrogen atmosphere, an attached substance and an oxide film on the surface of substrate 11 can be appropriately removed. In addition, in order to sufficiently fulfill a reduction effect with hydrogen, it is preferable that substrate 11 is heated up to between 1100° C. and 1200° C. and it is more preferable that after reaching the desired temperature, substrate 11 is kept at that temperature for 10 minutes to 20 minutes.

Then, while the hydrogen atmosphere is maintained in the reactor of the MOCVD apparatus, the temperature of substrate 11 is cooled down to about 500° C. as a temperature at which low-temperature buffer layer 12 is grown.

Here, cooling-down speed of substrate 11 is to be set so that substrate 11 is not cracked due to the thermal shock, similar to the above, and according to this embodiment, the temperature of substrate 11 is cooled down to about 500° C. in 20 minutes, similar to the case where it is heated up.

The temperature of substrate 11 at which low-temperature buffer layer 12 is grown is preferably between 500° C. and 600° C. This is because a quality of low-temperature buffer layer 12 considerably affects a crystal quality of each nitride semiconductor layer which constitutes a following element structure, so that it is preferable to provide an amorphous or polycrystalline state in a growing stage of low-temperature buffer layer 12.

Note that, before low-temperature buffer layer 12 is grown, ammonia may be supplied into the reactor of the MOCVD apparatus for a short time to nitride the surface of substrate 11.

When the temperature of substrate 11 reaches 500° C., TMG (trimethyl gallium) serving as a group-III raw material and ammonia serving as a group-V raw material are supplied at supply amounts of 10 μmol/min and 200 mmol/min, respectively to the reactor of the MOCVD apparatus, to grow amorphous GaN low-temperature buffer layer 12 on the C face of the sapphire substrate serving as substrate 11.

According to this embodiment, low-temperature buffer layer 12 composed of amorphous GaN is grown, but as low-temperature buffer layer 12, for example, GaN, AlN, or AlGaN having a given composition can be grown.

As the group-III raw material TEG (triethyl gallium) may be used. In addition, a layer thickness of low-temperature buffer layer 12 is preferably between 30 nm and 100 nm. According to this embodiment, amorphous low-temperature buffer layer 12 is grown, but polycrystalline low-temperature buffer layer 12 may be grown.

<<Growth of Undoped GaN Layer>>

Then, the supply of TMG into the reactor of the MOCVD apparatus is stopped, and the temperature of substrate 11 is heated up to about 1100° C. in 10 minutes, in a mixed atmosphere of ammonia and hydrogen serving as a carrier gas.

Here, as for the heating-up speed, it is preferable that the temperature of substrate 11 is heated up to about 1100° C. within 20 minutes in view of the thermal shock and crystallization of low-temperature buffer layer 12. In addition, it is preferable that the temperature of substrate 11 is heated up to be greater than or equal to 1000° C. to grow undoped GaN layer 13 as a single crystal.

In general, when the growth temperature is high, the crystal quality tends to be improved, but when the growth temperature is too high, an adverse effect such as rough surface is provided due to re-evaporation. Therefore, the temperature of substrate 11 is preferably about 1000° C. According to this embodiment, the temperature is set at 1100° C. When the temperature of substrate 11 reaches 1100° C., TMG is supplied at a supply amount of 100 μmol/min into the reactor of the MOCVD apparatus again, and undoped GaN layer 13 is grown on low-temperature buffer layer 12.

A layer thickness of undoped GaN layer 13 is preferably greater than or equal to 4 μm and more preferably, greater than or equal to 10 μm. In an early stage of the growth of undoped GaN layer 13, there is a case where dislocation is generated in high density due to lattice mismatch with substrate 11, in a vicinity of an interface between low-temperature buffer layer 12 and undoped GaN layer 13, and propagated in a layer thickness direction of undoped GaN layer 13. Mixed dislocation having Burgers vector composed of screw dislocation and edge dislocation has a property of disappearing with an increase in layer thickness, so that the mixed dislocation can be reduced by setting the thickness of undoped GaN layer 13 to preferably greater than or equal to 4 μm, or more preferably, greater than or equal to 10 μm. According to this embodiment, the layer thickness of undoped GaN layer 13 is set at 10 μm.

<<Growth of n-Type GaN Layer>>

Then, while TMG and ammonia are kept supplied to the reactor of the MOCVD apparatus, $SiH_4$ (silane) serving as a donor impurity raw material is supplied at a supply amount of 0.5 mmol/min, so that n-type GaN layer 14 is grown on undoped GaN layer 13.

Thus, n-type GaN layer 14 may be a single layer or multiple combined layers. When n-type GaN layer 14 is composed of combination of the plurality of layers, for example, a doping concentration of the donor impurity and a layer thickness of each layer may be different. In addition, a plurality of donor impurities and acceptor impurities may be doped as long as the n-type conductivity is provided as a result. Note that, it is considered that the combination of the plurality of layers has a structure in which the impurity concentrations are distributed in the layer thickness direction by changing the concentration of the impurity to be added, or adding two or more kinds of impurities, for example. According to this embodiment, n-type GaN layer 14 is a uniformly doped n-type single layer.

In addition, Si is used as the donor impurity and $SiH_4$ is used as its raw material just because the impurity concentration can be easily controlled, but TESi (tetraethylsilicon) serving as an organic compound can be used with no problem. Note that, as the donor impurity, any one or more elements of group-IV or group-VI such as Si or O can be used, and as a raw material, a hydroxide or an organic compound of the above element can be used.

The donor impurity concentration of n-type GaN layer 14 is preferably not less than $5 \times 10^{16}$ atoms/$cm^3$ and not more than $1 \times 10^{21}$ atoms/$cm^3$ with a view to improving the characteristics of the nitride semiconductor light-emitting element, and more preferably not less than $1 \times 10^{17}$ atoms/$cm^3$ and not more than $2 \times 10^{19}$ atoms/$cm^3$ with a view to further improving the characteristics of the nitride semiconductor light-emitting element.

<<Growth of Buffer Layer>>

Figure 3:
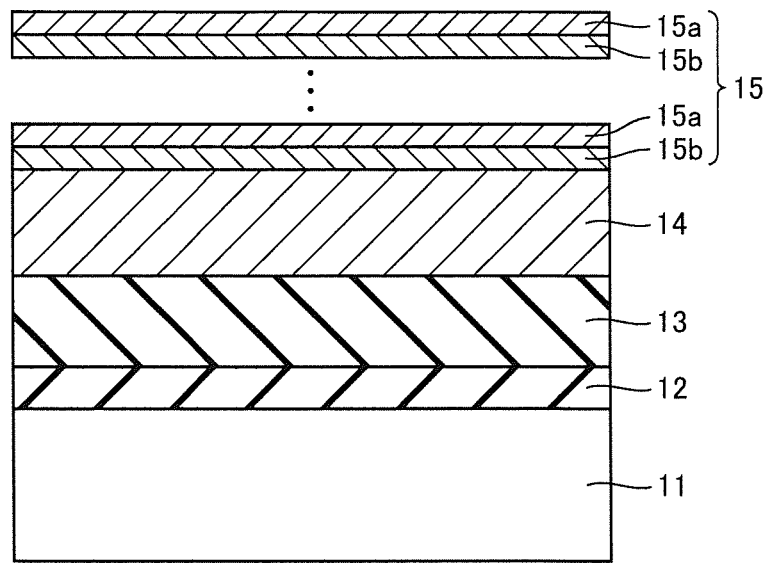
FIG. 3 is a schematic cross-sectional view illustrating another part of the production steps in the one example of the method for producing the nitride semiconductor light-emitting element in the first embodiment.

Then, as shown in FIG. 3, second buffer layer 15b expressed by the equation of $In_{x2}Ga_{1-x2}N$ ($0 \leq x2 < 1$, $x2 < x1$) and first buffer layer 15a expressed by the equation of $In_{x1}Ga_{1-x1}N$ ($0 < x1 \leq 1$) are alternately laminated, so that buffer layer 15 is laminated on n-type GaN layer 14.

For example, buffer layer 15 can be grown on n-type GaN layer 14 as follows.

First, the supply of the group-III raw material to the reactor of the MOCVD apparatus is stopped and the temperature of substrate 11 is cooled down to about 700° C. to 900° C. in the mixture atmosphere of ammonia and hydrogen serving as the carrier gas.

Here, the cooling-down speed is preferably set so as to reach the desired temperature within a time during which surface flatness of n-type GaN layer 14 can be maintained, and the temperature is preferably cooled down to about 700° C. and 900° C. within 10 minutes.

In addition, the temperature of substrate 11 at the time of growth of buffer layer 15 may be set to an appropriate value in view of the crystal quality and controllability of the In composition. In general, the higher the temperature of substrate 11 is at the time of the growth of buffer layer 15, the more the crystal quality is improved, but the In composition tends to be lowered. Therefore, the temperature of substrate 11 at the time of the growth of buffer layer 15 may be appropriately selected with a view to attaining desired In composition and crystal quality with high controllability.

Then, the carrier gas is changed from hydrogen to nitrogen, so that the atmosphere in the reactor of the MOCVD apparatus is set to a mixture atmosphere of ammonia and nitrogen. Here, nitrogen is weak in etching action to InGaN compared with hydrogen, so that the In composition and a layer thickness can be easily controlled. Thus, the temperature of substrate 11 is set at about 800° C., and TMG serving as the group-III raw material is supplied at a supply amount of 20 µmol/min, whereby second buffer layer 15b composed of GaN of buffer layer 15 is grown to 1.75 nm in thickness. Note that, the carrier gas is not limited to nitrogen, and for example, it may be hydrogen, or a mixture gas of nitrogen and hydrogen mixed at a given rate.

Then, TMI is supplied into the reactor of the MOCVD apparatus at a supply amount of 350 µmol/min, whereby first buffer layer 15a expressed by the equation of $In_{x1}Ga_{1-x1}N$ ($0<x1\leq1$) is grown to 1.75 nm in thickness.

Thus, while the supply amount of TMI is periodically changed at the time of growing first buffer layer 15a so that the In composition x1 of first buffer layer 15a is changed in the direction of the crystal growth of buffer layer 15, second buffer layers 15b and first buffer layers 15a are alternately laminated.

Figure 7:
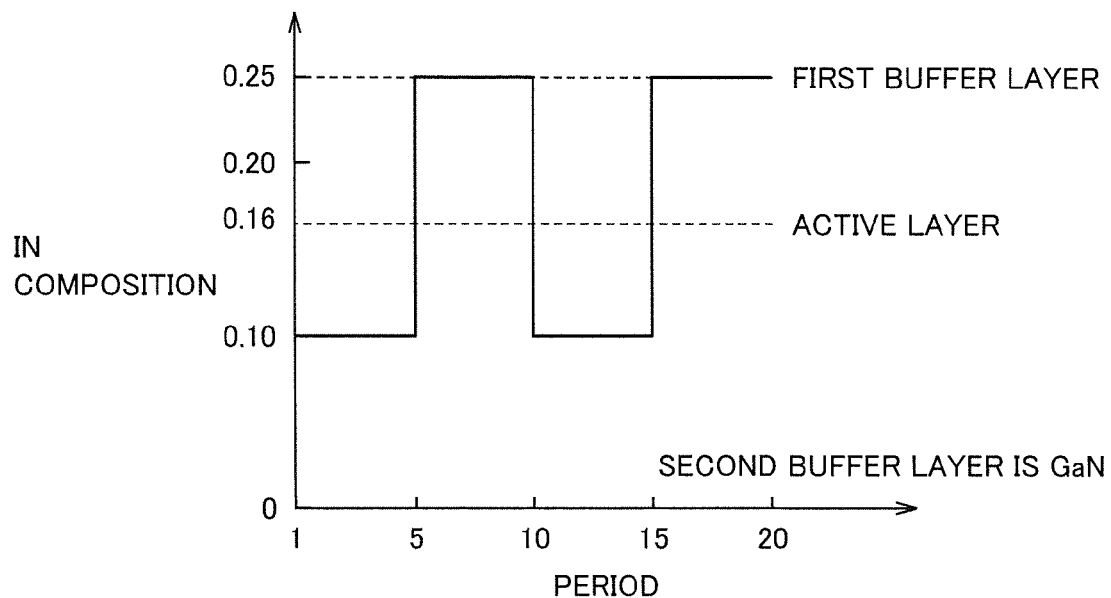
FIG. 7 is a diagram showing a change of an In composition x1 of a first buffer layer in a crystal growth direction in the first embodiment.

FIG. 7 shows the change of the In composition x1 of first buffer layer 15a in the direction of the crystal growth in the first embodiment. As shown in FIG. 7, the In composition x1 of first buffer layer 15a in the first embodiment is 0.1 between 1st and 5th periods and between 11th and 15th periods, and 0.25 between 6th and 10th periods and between 16th and 20th periods. In addition, the In composition x1 of first buffer layer 15a in the first embodiment is higher than the In composition (about 0.16) of a quantum well layer of active layer 16 between the 1st and the 5th periods and between the 10th and the 15th periods. That is, the In composition x1 of first buffer layer 15a arranged closest to active layer 16 is higher than the In composition of the InGaN quantum well layer of active layer 16.

In addition, an In composition x2 of second buffer layer 15b in the first embodiment is 0 between the 1st and the 20th periods, and constant under the condition that $0\leq x2<x1$. That is, second buffer layer 15b of the first embodiment is constantly composed of GaN.

According to this embodiment, as for the buffer layer 15, second buffer layer 15b expressed by the equation of $In_{x2}Ga_{1-x2}N$ ($0\leq x2<1$, $x2<x1$) and first buffer layer 15a expressed by the equation of $In_{x1}Ga_{1-x1}N$ ($0<x1\leq1$) are alternately laminated such that one period has a laminated structure composed of one second buffer layer 15b and one first buffer layer 15a, and 20 periods are provided in total. Thus, the In composition x1 of first buffer layer 15a is changed in the direction of the crystal growth every few periods in buffer layer 15. Note that, the number of the periods is not limited, as a matter of course.

In addition, the layer thickness of first buffer layer 15a and the layer thickness of second buffer layer 15b are not particularly limited, but according to this embodiment, they are both about 1.75 nm, and thus, buffer layer 15 is foamed so as to have a superlattice structure having 20 periods and provided by alternately laminating first buffer layers 15a as the quantum well layers and second buffer layers 15b as barrier layers.

In the case of the superlattice structure provided by alternately laminating first buffer layers 15a and second buffer layers 15b in buffer layer 15, each of the layer thickness of first buffer layer 15a and the layer thickness of second buffer layer 15b is preferably to be less than or equal to 2.5 nm.

In addition, in order to prevent self-absorption of the light generated in active layer 16, an effective bandgap of buffer layer 15 (decided by base quantum levels of a conduction band and a valence band in regard to coupling of quantum well layers) is preferably larger than an effective bandgap of active layer 16.

For example, in a case where the effective bandgap of active layer 16 is 2.8 eV which corresponds to an emission wavelength of 450 nm, the effective bandgap of buffer layer 15 is to be greater than or equal to 3 eV, and the In composition x1 of first buffer layer 15a and the In composition x2 of second buffer layer 15b are preferably selected so as to satisfy relations such that $0<x1\leq1$, $0\leq x2<1$, and $x2<x1$.

Note that, the bigger a lattice constant difference from base n-type GaN layer 14, the faster progress of lattice relaxation provided after buffer layer 15 reaches a critical film thickness (at which the lattice relaxation starts). Therefore, as the In composition of InGaN in buffer layer 15 becomes higher, the total layer thickness of buffer layer 15 can be reduced. Meanwhile, with a view to improving the crystallinity of first buffer layer 15a, the In composition x1 of first buffer layer 15a is preferably smaller than 0.4.

For example, when the In composition x1 of first buffer layer 15a is 0.2, the critical film thickness of first buffer layer 15a is about 6 nm, and when it is 0.4, the critical film thickness of first buffer layer 15a is estimated to be about 3 nm. When the buffer layer 15 has the superlattice structure, the critical film thickness of first buffer layer 15a roughly quadruples, so that it is preferable that the layer thickness and the period of first buffer layer 15a is configured so that the total layer thickness of first buffer layers 15a exceeds 24 nm. According to this embodiment, the layer thickness of first buffer layer 15a is 1.75 nm, the number of periods of the alternately laminated body of first buffer layers 15a and second buffer layers 15b is 20, and the total layer thickness of first buffer layers 15a in buffer layer 15 is 35 nm, so that the lattice relaxation starts in the middle of buffer layer 15.

In addition, according to this embodiment, the In composition x1 of first buffer layer 15a is changed by changing the supply amount of TMI to the reactor of the MOCVD apparatus, but the buffer layer 15 can be grown similarly to the above, for example, by changing the temperature of substrate 11 every growth of first buffer layer 15a while keeping constant the supply amount of TMI and TMG into the reactor of the MOCVD apparatus. Incorporation of In to the crystal is considerably affected by the temperature of substrate 11, and when the temperature of substrate 11 is low, the In composition tends to become high, and when the temperature of substrate 11 is high, the In composition tends to become low.

<<Growth of Active Layer>>

Figure 4:
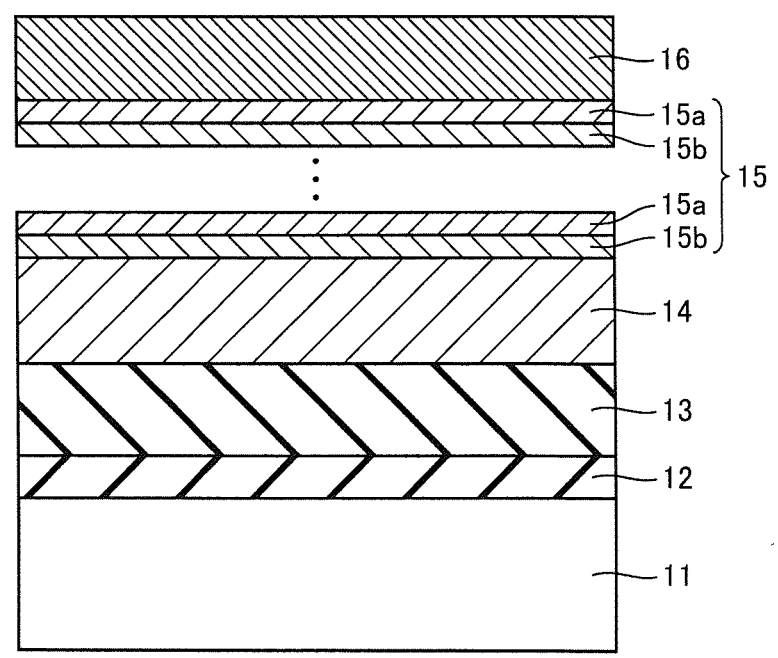
FIG. 4 is a schematic cross-sectional view illustrating another part of the production steps in the one example of the method for producing the nitride semiconductor light-emitting element in the first embodiment.

Then, as shown in FIG. 4, active layer 16 is laminated on buffer layer 15. For example, active layer 16 can be grown on buffer layer 15 as follows.

First, only the carrier gas, ammonia serving as a group-V raw material, and TMG serving as the group-III raw material are supplied at a supply amount of 20 µmol/min to the reactor of the MOCVD apparatus while the temperature of substrate 11 is kept at about 800° C., whereby a GaN barrier layer is grown to about 8 nm in thickness on buffer layer 15. Herein, as the barrier layer of active layer 16, for example, a nitride semiconductor crystal expressed by an equation of $Al_{x3}In_{y3}Ga_{1-x3-y3}N$ ($0\leq x3\leq1$, $0\leq y3\leq1$, $0<x3+y3\leq1$) can be used.

Here, when the temperature of substrate 11 is high, In is not likely to be incorporated, and when the temperature of substrate 11 is too low, the crystal quality deteriorates, so that the temperature of substrate 11 is preferably set in a vicinity of the growth temperature of buffer layer 15. In view of the incorporation of In, the temperature of substrate 11 may be lowered to about 700° C., but the temperature is preferably cooled down quickly in the mixture atmosphere of nitrogen and ammonia in order to prevent thermal deterioration of buffer layer 15.

Then, TMI is additionally supplied at a flow rate of 550 µmol/min into the reactor of the MOCVD apparatus, so that the InGaN quantum well layer is grown to about 4 nm in thickness. A designed value of the In composition of the InGaN quantum well layer is about 0.16. Herein, as the quantum well layer of active layer 16, for example, a nitride semiconductor crystal expressed by an equation of $Al_{x4}In_{y4}Ga_{1-x4-y4}N$ ($0 \le x4 \le 1$, $0 \le y4 \le 1$, $0 < x4+y4 \le 1$) can be used.

Then, while only the supply of TMI is periodically stopped, active layer 16 is grown by laminating 6 periods of GaN/InGaN.

Then, with a view to preventing the InGaN quantum well layer from deteriorating in a heating-up process to grow the upper layer on active layer 16, a GaN barrier layer having a thickness of 16 nm which is twice as thick as the other GaN barrier layer is grown on a surface of the InGaN quantum well layer exposed as an uppermost layer.

After the growth of active layer 16, ammonia and nitrogen serving as the carrier gas are supplied into the reactor of the MOCVD apparatus, and the temperature of substrate 11 is heated up to 1000° C. The heating-up process after the growth of active layer 16 is preferably performed in as short a time as possible. This is mainly because the InGaN quantum well layer in active layer 16 is unstable to the heat, and the In composition and the layer thickness of the InGaN quantum well layer are likely to become uneven due to inflow of thermal energy for a long time, so that it is necessary to prevent steepness of an interface between the InGaN quantum well layer and the GaN barrier layer from deteriorating.

The unevenness in In composition and layer thickness of the InGaN quantum well layer of active layer 16, and the deterioration in steepness of the interface between the InGaN quantum well layer and the GaN barrier layer cause an increase in half-value width of emission spectrum of the nitride semiconductor light-emitting element and a reduction in emission intensity. The reduction in quality of active layer 16 is directly connected to a reduction in internal quantum efficiency and current injection efficiency, so that this needs to be sufficiently taken care of in the crystal growth. According to this embodiment, the achieving temperature of substrate 11 is set at 1000° C., but in view of the thermal damage to active layer 16, the temperature of substrate 11 is preferably as low as possible to the extent that the crystal quality can be maintained.

Note that, according to this embodiment, the In composition of the InGaN quantum well layer in active layer 16 is the same, but it may be changed in the growth direction of active layer 16. When the In composition of the InGaN quantum well layer is changed in the growth direction of active layer 16, the emission spectrum of the nitride semiconductor light-emitting element becomes broad, a plurality of peaks are provided depending on the change, and multicolor emission is shown in some cases. Therefore, when monomodality of the emission spectrum of the nitride semiconductor light-emitting element and its half-value width are required to be small, the In composition is preferably the same in the InGaN quantum well layer and between the InGaN quantum well layers.

In the heating-up process after the growth of active layer 16, the temperature of substrate 11 is preferably between 900° C. and 1100° C. According to this embodiment, the temperature of substrate 11 is heated up from 800° C. to 1000° C. in 3 minutes. A carrier gas in the heating-up process is nitrogen in view of an influence of re-evaporation. As the carrier gas, nitrogen is preferably used because hydrogen is strong in etching action to InGaN.

<<Growth of Carrier Barrier Layer>>

Figure 5:
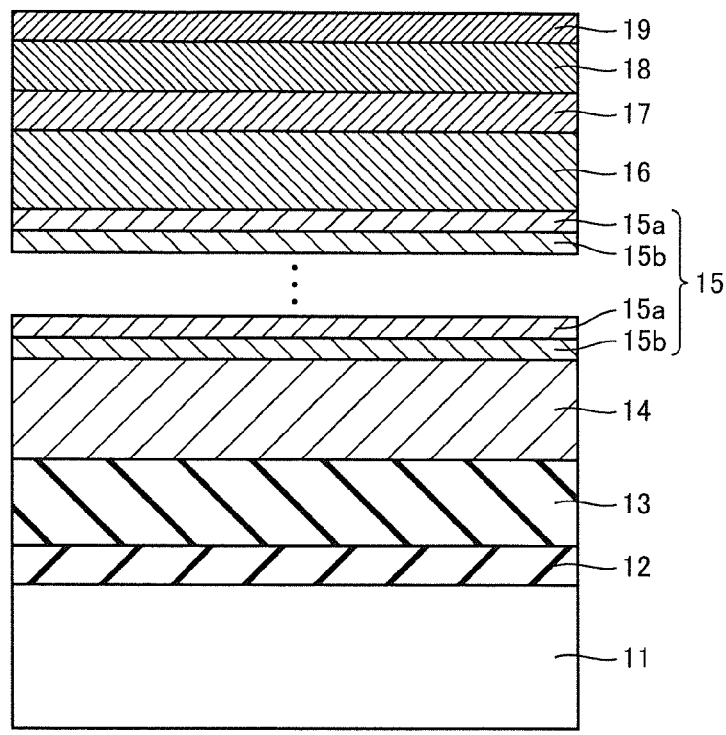
FIG. 5 is a schematic cross-sectional view illustrating another part of the production steps in the one example of the method for producing the nitride semiconductor light-emitting element in the first embodiment.

Then, as shown in FIG. 5, carrier barrier layer 17 is laminated on active layer 16. For example, carrier barrier layer 17 can be grown on active layer 16 as follows.

When the temperature of substrate 11 reaches 1000° C., TMG and TMA (trimethyl aluminum) serving as group-III raw materials are supplied at supply amounts of 30 µmol/min and 20 µmol/min, respectively into the reactor of the MOCVD apparatus. In addition, in order to dope Mg serving as an acceptor impurity so that carrier barrier layer 17 becomes p type, Cp2Mg (Bis(cyclopentadienyl)magnesium) is supplied at a supply amount of 1 µmol/min, whereby carrier barrier layer 17 is grown on active layer 16.

Since carrier barrier layer 17 has a function to prevent electrons from overflowing toward the p-type layer when the current is injected, it preferably has a relatively high Al composition. The Al composition of carrier barrier layer 17 is preferably not less than 10 atomic % and not more than 30 atomic %. In addition, a layer thickness of carrier barrier layer 17 is preferably not less than 10 nm and not more than 30 nm. In order to effectively prevent the electrons from overflowing toward the p-type layer, it is preferable that the layer thickness of carrier barrier layer 17 is decreased when the Al composition of carrier barrier layer 17 is high, while the layer thickness of carrier barrier layer 17 is increased when the Al composition is low.

According to this embodiment, the Al composition of carrier barrier layer 17 is 20 atomic %, and the layer thickness thereof is 20 nm. In addition, according to this embodiment, carrier barrier layer 17 is grown with nitrogen used as the carrier gas, but it may be grown in a hydrogen atmosphere. For example, when hydrogen is used as the carrier gas before the crystal growth (for example, in the heating-up step after the growth of active layer 16), the influence of the re-evaporation of In is great as described above, which is not preferable, but there is no problem in terms of using hydrogen as the carrier gas while AlGaN having relatively strong connection (therefore, re-evaporation hardly occurs, and protection effect is great) is grown.

In addition, according to this embodiment, carrier barrier layer 17 is grown after the heating-up step after the growth of active layer 16, but carrier barrier layer 17 can be grown in the heating-up step after the growth of active layer 16. In the case where carrier barrier layer 17 is grown in the heating-up step, since the temperature of substrate 11 is changed from moment to moment, the Al composition is changed with the temperature of substrate 11, so that it is necessary to pay attention to its design.

In addition, according to this embodiment, Cp2Mg is used as the Mg raw material, but EtCp2Mg (Bis(ethylcyclopentadienyl) magnesium) may be used. In addition, as the acceptor impurity, Be, Zn, or C can be used instead of Mg. As the raw material of the acceptor impurity, its organic compound is used in general.

<<Growth of p-Type GaN Layer>>

Then, the supply of TMA into the reactor of the MOCVD apparatus is stopped, and p-type GaN layer 18 having a thickness of 60 nm is grown on carrier barrier layer 17. It is preferable that p-type GaN layer 18 has the thickness so that injected holes can be sufficiently diffused in the plane of active layer 16, in view of uniform current injection to active layer 16. According to this embodiment, the thickness of p-type GaN layer 18 is 60 nm, but it is not limited in particular and it is preferably not less than 30 nm and not more than 100 nm. When the thickness of p-type GaN layer 18 is set to greater than or equal to 30 nm, resistance of p-type GaN layer 18 becomes high in the plane direction, and the holes are sufficiently diffused in the plane of p-type GaN layer 18 so that the current can be likely to be injected uniformly in active layer 16. When the thickness of p-type GaN layer 18 is less than or equal to 100 nm, serial resistance to the current flowing in the layer thickness direction of p-type GaN layer 18 is reduced, so that it is likely that a driving voltage is lowered and power conversion efficiency is improved.

<<Growth of p-Type GaN Contact Layer>>

Finally, p-type GaN contact layer 19 is grown to 30 nm in thickness on p-type GaN layer 18 by increasing a supply amount of Cp2Mg to the reactor of the MOCVD apparatus to 2 μmol/min.

Herein, it is necessary to increase a Mg concentration in p-type GaN contact layer 19 in order to obtain an ohmic contact with p electrode 20, so that the supply amount of Cp2Mg is doubled compared with p-type GaN layer 18 serving as a base.

<<Cooling-Down Step>>

Substrate 11 after the growth of p-type GaN layer 18 is cooled down to room temperature, in a mixture gas atmosphere of ammonia and nitrogen as the carrier gas in the reactor of the MOCVD apparatus. Here, as for a cooling-down time, the temperature is cooled down from 1000° C. to room temperature in 30 minutes in view of a damage of substrate 11.

Note that, when substrate 11 is cooled down, the supply amount of ammonia may be reduced to 30 mmol/min, but in a case where the supply of ammonia is stopped, it is preferable that an appropriate amount of ammonia is kept supplied until after the temperature reaches at least less than or equal to 400° C. because the grown nitride semiconductor crystal is thermally decomposed. In addition, in a case where hydrogen is supplied while substrate 11 is cooled down, the grown nitride semiconductor crystal could be damaged due to the re-evaporation.

<<Activation Treatment Step>>

It is preferable to perform a heat treatment (activation treatment) to activate Mg serving as the acceptor after substrate 11 is taken out of the MOCVD apparatus after the growth of p-type GaN contact layer 19. The acceptor impurity doped in the nitride semiconductor crystal replaces a group-III site, but it is inactivated by hydrogen, and the resistance of the p-type layer is high just after taken out of the MOCVD apparatus, so that it is preferable to isolate the acceptor impurity and hydrogen under appropriate temperature and atmosphere, to activate the acceptor impurity.

In the activation treatment step, it is preferable to heat up substrate 11 after the growth of p-type GaN contact layer 19 to a temperature of not less than 800° C. and not more than 900° C. in a short time, in order to prevent the nitride semiconductor layer formed on substrate 11 from being unnecessarily damaged (such as surface roughness due to a heat treatment under a high temperature for a long time).

The activation treatment step is preferably performed in a nitride atmosphere or a mixture gas atmosphere of nitrogen and oxygen, but it may be performed in a rear gas atmosphere of Ar, or a mixture gas atmosphere of rear gas and oxygen. When oxygen is mixed into the atmosphere in the activation treatment step, hydrogen is effectively removed from the nitride semiconductor layer laminated on substrate 11, but when an oxygen concentration in the atmosphere becomes high, an adverse effect such as formation of a surface oxide film is generated, so that the oxygen concentration in the atmosphere is preferably to be less than or equal to 50 ppm.

In addition, the heat treatment is preferably performed for less than or equal to 10 minutes. In addition, the activation treatment step is preferably performed in a heating treatment furnace capable of heating up or cooling down at high speed using resistance heating or halogen lamp heating.

In addition, according to this embodiment, the heating treatment is performed at 850° C. for 2 minutes in the mixture gas atmosphere of nitrogen and oxygen having the concentration of 5 ppm.

After the above activation treatment step, according to this embodiment, in order to evaluate the mixed crystal composition and the impurity concentration of the nitride semiconductor layer laminated on substrate 11, an X-ray diffraction method, SIMS (secondary ion mass spectrometry), and C-V measurement have been performed, and it is found that a Si concentration of n-type GaN layer 14 is $2\times10^{18}$ atoms/cm$^3$, a Mg concentration of carrier barrier layer 17 and p-type contact layer 19 is $1\times10^{20}$ atoms/cm$^3$, and a Mg concentration of p-type GaN layer 18 is $1\times10^{19}$ atoms/cm$^3$.

It has been confirmed that the composition of each layer and the layer thicknesses of the periodic structures of buffer layer 15 and active layer 16 are provided as designed. As for a carrier concentration obtained by the C-V measurement, n-type GaN layer 14 is $2\times10^{18}$ atoms/cm$^3$, and buffer layer 15 is $2\times10^{16}$ atoms/cm$^3$. In addition, it has been confirmed that p-type carrier concentrations of carrier barrier layer 17, p-type GaN layer 18, and p-type contact layer 19 are $8\times10^{17}$ atoms/cm$^3$, $1\times10^{17}$ atoms/cm$^3$, and $1\times10^{18}$ atoms/cm$^3$, respectively.

According to the first embodiment, an n-type impurity is not doped in buffer layer 15, but the n-type impurity such as Si may be doped to form buffer layer 15 into the n type, for example. In this case, the n-type impurity such as Si can be doped in one or both of first buffer layer 15a and second buffer layer 15b. In addition, in the case where the n-type impurity such as Si is doped in buffer layer 15, the n-type impurity such as Si is preferably doped in buffer layer 15 so that a Si density shows a value appropriate to a carrier density of n-type GaN layer 14.

Therefore, in the case where the n-type impurity such as Si is doped only one of first buffer layer 15a and second buffer layer 15b, it is preferable to adjust a doping amount of the n-type impurity such as Si so that buffer layer 15 has a desired carrier density in view of the fact that the buffer layer which is not doped with the n-type impurity is in the undoped state.

Since activation energy of Mg in the nitride semiconductor crystal is considerably high, it is said that an activation rate is in the order of %, and it is about 1% in this embodiment. Only an activation rate of carrier barrier layer 17 is lower than that of the other layers, but this is because AlGaN has a wide bandgap.

It has been confirmed that the In composition of each of buffer layer 15 and active layer 16 found by EDX (energy dispersive X-ray analysis) supplied with TEM (transmission electron microscope) in addition to the X-ray diffraction method has a desired value. It is to be noted that each layer cannot be completely evaluated individually due to convergence diameter of an electron beam and spread of the electron beam applied in the EDX measurement. As for the EDX measurement, information from both adjacent layers of the target layer is included to some extent, and although the value contains an error more or less, it is not far from reality, so that it is thought that there is no practical problem in precision.

<<Electrode Forming Step>>

Figure 6:
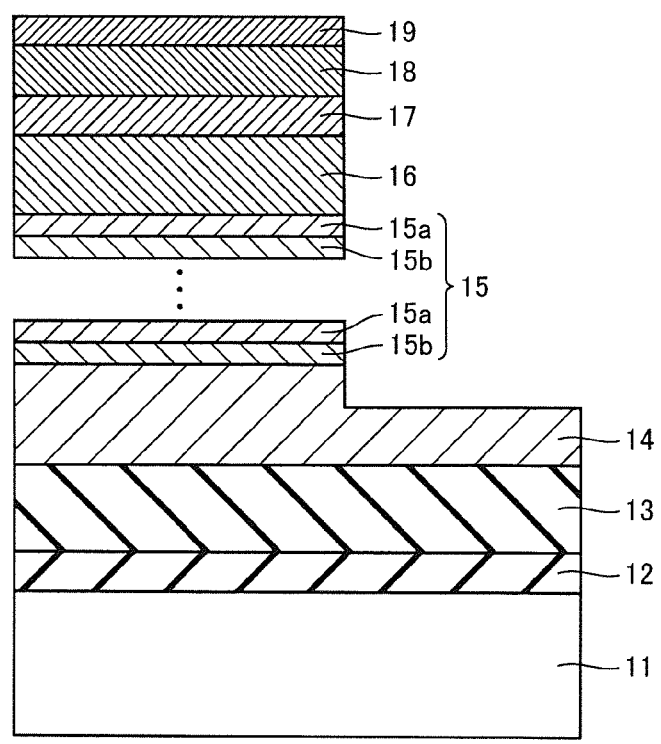
FIG. 6 is a schematic cross-sectional view illustrating another part of the production steps in the one example of the method for producing the nitride semiconductor light-emitting element in the first embodiment.

Then, an electrode pattern and an etching pattern are formed on the nitride semiconductor layer on substrate 11 after the activation treatment step, by normal photolithography, and etching is performed by RIE (reactive ion etching), whereby the surface of n-type GaN layer 14 is exposed and a mesa shape is formed as shown in FIG. 6.

Then, as shown in FIG. 1, n electrode 10 and p electrode 20 are formed on the surface of n-type GaN layer 14 and the surface of p-type contact layer 19, respectively, a heat treatment is performed for alloying, and substrate 11 is ground to about 100 μm in thickness and divided into chips through a normal dicing step. Thus, the nitride semiconductor light-emitting element in the first embodiment is produced as shown in FIG. 1.

<<Function Effect>>

According to the nitride semiconductor light-emitting element in the first embodiment, compared with the state in which active layer 16 is laminated without performing lattice relaxation, depending on a degree of the lattice relaxation of buffer layer 15, three kinds of states may be provided such as (I) active layer 16 is partially in the state of the lattice relaxation and has an in-plane lattice constant close to that of a bulk, (II) active layer 16 is totally in the state of lattice relaxation (bulk state), and (III) active layer 16 has a strain having a sign opposite to that of a case where active layer 16 is laminated on buffer layer 15 which has not performed the lattice relaxation, in the plane.

What state is taken from the three kinds depends on the degree of the lattice relaxation of buffer layer 15, but like buffer layer 15 in the first embodiment, in the case where the In composition x1 of first buffer layer 15a is changed, and the In composition x1 of at least one layer of first buffer layers 15a is set higher than the In composition of the quantum well layer of active layer 16, the strain applied to active layer 16 can be relaxed, compared with the case where the element is grown coherently with respect to GaN like Patent Document 1, so that an amount of the internal electric field caused by the piezoelectric polarization can be reduced.

Herein, the state laminated without performing the lattice relaxation means a state in which the active layer is coherently grown on the base GaN in Patent Document 1, and the large internal electric field is generated in the InGaN well layer of the active layer due to the piezoelectric polarization, so that the electron and the hole are spatially separated, and the radiative recombination lifetime is long.

Therefore, according to active layer 16 of the nitride semiconductor light-emitting element in the first embodiment, compared with the active layer of the element described in Patent Document 1, the strain applied to active layer 16 is relaxed. Therefore, according to the nitride semiconductor light-emitting element in the first embodiment, the spatial separation between the electron and the hole is reduced, and the radiative recombination lifetime is reduced, so that the internal quantum efficiency becomes high according to the above equation (i).

When InGaN is coherently grown on GaN, it is grown under compression strain generated due to a lattice constant difference from the substrate, and strain energy is accumulated. Dislocation is generated when InGaN reaches a certain film thickness, and system energy becomes stable. This is called the lattice relaxation, and this film thickness is called a critical film thickness. For example, in theory, when an In composition x of $In_xGa_{1-x}N$ is 0.2, the critical thickness is assumed to be about 6 nm. It is experimentally known that this critical film thickness is increased to be several-fold thicker in the superlattice structure. According this embodiment, this lattice relaxation is positively used.

That is, by providing first buffer layer 15a expressed by the equation of $In_{x1}Ga_{1-x1}N$ (0<x1≤1) having the In composition x1 larger than the In composition of active layer 16 while changing the In composition in buffer layer 15, the lattice relaxation of buffer layer 15 is facilitated.

As for active layer 16 grown coherently on buffer layer 15 in which the lattice relaxation is provided, compared with the active layer grown coherently on the buffer layer in which the lattice relaxation is not provided, the compression strain in the plane can be reduced. That is, because of the formation of the buffer layer 15, force working in a direction to relax the compression strain applied to active layer 16 can be applied to the active layer, or tensile strain can be formed in active layer 16.

Thus, the internal electric field caused by the piezoelectric polarization is reduced in active layer 16, the electron and the hole spatially come close to each other in the quantum well layer, the electron and the hole are not likely to be separated, and the radiative recombination lifetime becomes short, so that the internal quantum efficiency can be improved according to the above equation (i).

Herein, in the case where active layer 16 has the plurality of nitride semiconductor layers having the different In compositions, the In composition x1 of at least one layer of first buffer layers 15a has to be higher than the In composition of the nitride semiconductor layer having the highest In composition in active layer 16.

Hereinafter, a further provided effect in the nitride semiconductor light-emitting element in this embodiment will be described.

According to the nitride semiconductor light-emitting element in this embodiment, the In composition of first buffer layer 15a of buffer layer 15 is changed, the lattice mismatch difference from substrate 11 is gradually increased, and buffer layer 15 gradually performs the lattice relaxation, so that the crystallinity of active layer 16 can be maintained.

In addition, buffer layer 15 has the superlattice structure, so that the dislocation generated during the lattice relaxation and threading dislocation from substrate 11 are mostly bent by the stress at the time of the growth of buffer layer 15, form dislocation loops and disappear. Therefore, the threading dislocation and a pit density which is considered to be caused by it are reduced. That is, the crystallinity is maintained, and the defect is reduced, so that the non-radiative recombination process is reduced, and the non-radiative recombination lifetime is increased, and as a result, the internal quantum efficiency is improved according to the above equation (i).

In addition, the radiative recombination lifetime is reduced, a following phenomenon occurs. A rate equation of the carrier in active layer 16 is expressed by following equations (iii) and (iv), wherein G represents injected carriers at the time of a drive current, n represents a carrier density, τr represents the radiative recombination lifetime, τnr represents the non-radiative recombination lifetime, and τPL represents the emission lifetime.

$$1/\tau PL=(1/\tau r)+(1/\tau nr) \quad \text{(iii)}$$

$$dn/dt=G+(n/\tau PL) \quad \text{(iv)}$$

Here, dn/dt=0 is satisfied in a steady state, so that the carrier density n is expressed by a following equation (v).

$$n=G\tau PL \quad \text{(v)}$$

Therefore, according to the above equation (v), in a case where τnr is constant, when the radiative recombination lifetime τr is reduced, the emission lifetime τPL is also reduced, so that the static carrier density n in active layer 16 is reduced.

When the static carrier density in active layer 16 is reduced, Auger recombination process which does not contribute to the light emission and is proportional to the cube of the carrier density, and overflow of the carrier are reduced, so that a droop phenomenon is reduced, the above effect can be obtained in any drive current area, and the internal quantum efficiency can be improved at any carrier density.

<<Evaluation of LED Element>>

The chip-shaped nitride semiconductor light-emitting element in the first embodiment is mounted on a normal stem with an Au—Sn solder, connects the electrode and a terminal with an Au wire, and molded with a transparent epoxy resin, whereby the LED element in the first embodiment is completed.

Characteristics of the LED element in the first embodiment are confirmed by turning on the LED element in the first embodiment produced as described above. An emission wavelength and a light output at a drive current of 20 mA of the LED element in the first embodiment are 447 nm and 45 mW, respectively, and a light output at a drive current of 60 mA is 70 mW (about 1.6 times compared with that at 20 mA).

For comparison, an LED element in a comparison example 1 is produced in the same way as that in the first embodiment except that instead of first buffer layer 15a of buffer layer 15 described in this embodiment, a first buffer layer expressed by an equation of $In_{0.08}Ga_{0.92}N$ having an In composition lower than that of the InGaN quantum well layer of active layer 16 and a second buffer layer composed of GaN are alternately laminated to form a strained superlattice layer (a structure of this strained superlattice layer is referred to as a structure X). According to the LED element in the comparison example 1, the In composition of the first buffer layer is lower than that of the InGaN quantum well layer of the active layer, so that the buffer layer does not perform the lattice relaxation. In addition, the LED element in the comparison example 1 is formed such that an active layer composed of MQW is coherently grown on the strained superlattice layer.

Light outputs of the LED element in the comparison example 1 at drive currents of 20 mA and 60 mA are 35 mW and 46 mW (about 1.3 times compared with that at 20 mA), respectively.

Since the internal quantum efficiency of the nitride semiconductor light-emitting element in the first embodiment having buffer layer 15 is improved, the light output of the LED element in the first embodiment is improved compared with the LED element in the comparison example 1. The reason is as follows.

The In composition x1 of first buffer layer 15a expressed by the equation of $In_{x1}Ga_{1-x1}N$ (0<x1≤1) of buffer layer 15 is changed and higher than the In composition of the quantum well layer of active layer 16, so that the lattice relaxation of buffer layer 15 is facilitated.

Therefore, the strain applied to the InGaN quantum well layer grown on buffer layer 15 is reduced, and the internal electric field caused by the piezoelectric polarization is reduced, compared with the active layer having the InGaN well layer having the conventional structure X. As a result, it is considered that the electron and the hole injected into the InGaN active layer are small in spatial separation and likely to be recombined, and the radiative recombination lifetime is reduced, so that the internal quantum efficiency is improved according to the above equation (i).

In addition, as will be described in a following embodiment, due to a periodical laminated structure of first buffer layer 15a expressed by the equation of $In_{x1}Ga_{1-x1}N$ (0<x1≤1) and second buffer layer 15b expressed by the equation of $In_{x2}Ga_{1-x2}N$ (0≤x2<1, x2<x1), it is considered that a defect density in buffer layer 15 is reduced, and a non-radiative recombination center is reduced, that is, the non-radiative recombination lifetime is increased due to the improvement in crystallinity, which leads to the improvement of the internal quantum efficiency.

Furthermore, since the radiative recombination lifetime is reduced, the steady carrier density is reduced, so that an increase rate of the light output when the injected current amount is increased from 20 mA to 60 mA is 1.6 times in the LED element in the first embodiment, which is considerably high, compared with 1.3 times of the LED element in the comparison example 1 having the conventional structure. This is considered because the internal quantum efficiency is improved in any current region by using buffer layer 15 having the above structure.

<<Other Configurations>>

According to this embodiment, as the nitride semiconductor layer, GaN, InGaN, and AlGaN are used, but a nitride semiconductor crystal expressed by an equation $Al_\alpha In_\beta Ga_\gamma N$ (0≤α≤1, 0≤β≤1, 0≤γ≤1, α+β+γ≠0) can be used independently, and a part of the group-III element may be replaced with B (boron), or a part of N (nitrogen) serving as the group-V element may be replaced with P (phosphorous) and/or As (arsenic).

According to this embodiment, the nitride semiconductor light-emitting element layer is laminated on substrate 11 by the MOCVD method, but instead of the MOCVD method, a vapor-phase growth method as typified by a HVPE (Hydride Vapor Phase Epitaxy) method, or MBE (Molecular Beam Epitaxy) method, or a liquid-phase growth method such as a hydrothermal synthesis method in which a crystal is grown in a supercritical fluid, or a flux method can be used. The method for laminating the nitride semiconductor layers is not specifically limited, and for example, the above growth methods may be used independently or two or more of them may be combined and used.

According to this embodiment, the n-type nitride semiconductor layer, buffer layer 15, active layer 16, and the p-type nitride semiconductor layer are grown on substrate 11 in this order, but buffer layer 15 only needs to be grown before active layer 16, and other layers may be formed in any order. For example, the p-type nitride semiconductor layer, buffer layer 15, active layer 16, and the n-type nitride semiconductor layer may be grown on substrate 11 in this order.

Second Embodiment

In a second embodiment, a description will be given of characteristics in a case where the In composition x1 of first buffer layer 15a of buffer layer 15 is changed so as to be monotonically increased every few periods in the laminated structure of first buffer layer 15a and second buffer layer 15b.

Figure 8:
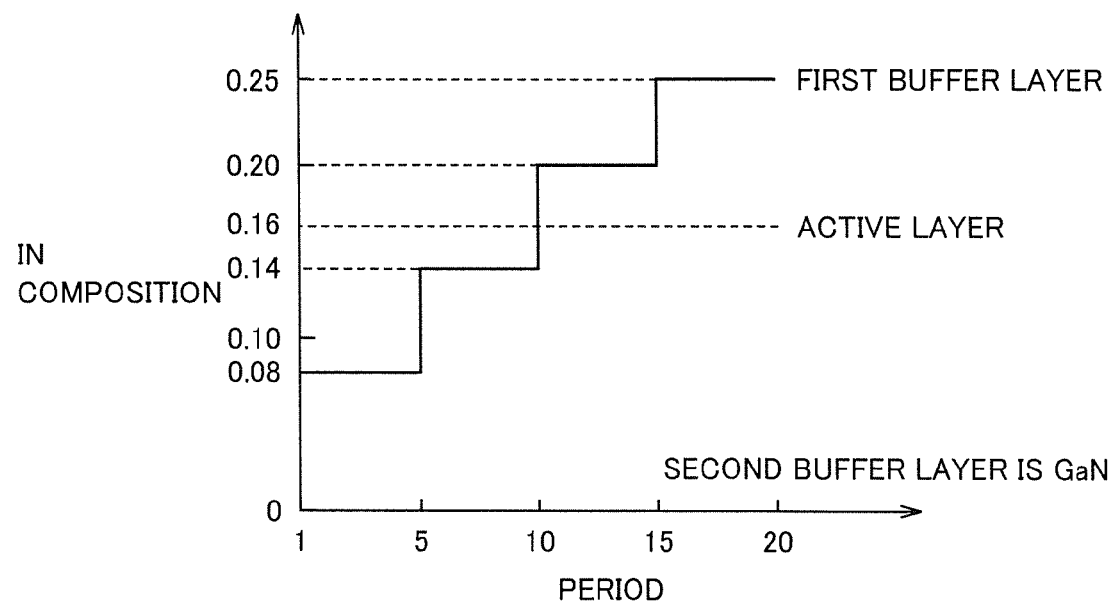
FIG. 8 is a diagram showing a change of an In composition x1 of a first buffer layer in a crystal growth direction in a second embodiment.

FIG. 8 shows a change of the In composition x1 of first buffer layer 15a in a direction of crystal growth in the second embodiment. As shown in FIG. 8, the In composition x1 of first buffer layer 15a in the second embodiment is 0.08 between 1st and 5th periods, it is 0.14 between 6th and 10th periods, it is 0.20 between 11th and 15th periods, and it is 0.25 between 16th and 20th periods. That is, according to buffer layer 15 in the second embodiment, the In composition x1 of first buffer layer 15a is increased in stages toward active layer 16.

Here, the In composition x1 of first buffer layer 15a in the second embodiment is higher than the In composition (about 0.16) of the quantum well layer of active layer 16 between 11th and 20th periods. That is, the In composition x1 of first buffer layer 15a in the 20th period arranged closest to active layer 16 is higher than the In composition of the InGaN quantum well layer of active layer 16.

In addition, the In composition x2 of second buffer layer 15b in the second embodiment is 0 between the 1st and the 20th periods, and GaN is maintained. That is, In composition x2 of second buffer layer 15b is constant within a range satisfying that $0 \leq x2 < x1$.

Herein, buffer layer 15 in the second embodiment can be formed by increasing a supply amount of TMI in accordance with the increase of the In composition x1 of first buffer layer 15a while first buffer layers 15a are crystal grown by the MOCVD method.

Thus, similar to the first embodiment, an LED element in the second embodiment is produced with the nitride semiconductor light-emitting element in the second embodiment.

Thus, the LED element in the second embodiment is evaluated, and it is confirmed that an emission wavelength and a light output of the LED element in the second embodiment at a drive current of 20 mA are 447 nm and 46 mW, respectively, and a light output at a drive current of 60 mA is 74 mW (about 1.6 times compared with that at 20 mA). Meanwhile, as described above, the light outputs of the LED element in the comparison example 1 having the conventional structure at the drive currents of 20 mA and 60 mA are 35 mW and 46 mW (about 1.3 times as compared with that at 20 mA), respectively.

Herein, as for buffer layer 15 in the second embodiment, when the In composition x1 of first buffer layer 15a is linearly increased toward active layer 16, the same effect as the LED element in the second embodiment can be also obtained.

In addition, as for buffer layer 15 in the second embodiment, when the In composition x1 of first buffer layer 15a is increased in an exponential manner toward active layer 16, the same effect as that of the LED element in the second embodiment can be obtained.

It is considered that the above effect can be obtained because the internal quantum efficiency of the nitride semiconductor light-emitting element in the second embodiment is improved by increasing the In composition x1 of first buffer layer 15a in buffer layer 15 continuously or in stages toward active layer 16, and making the In composition x1 of first buffer layer 15a arranged closest to active layer 16, higher than the In composition of the InGaN quantum well layer of active layer 16.

In addition, a description other than the above in the second embodiment is the same as that of the first embodiment, so that the description is omitted.

Third Embodiment

In a third embodiment, a description will be given of characteristics in a case where not only the In composition x1 of first buffer layer 15a but also the In composition x2 of second buffer layer 15b is changed.

Figure 9:
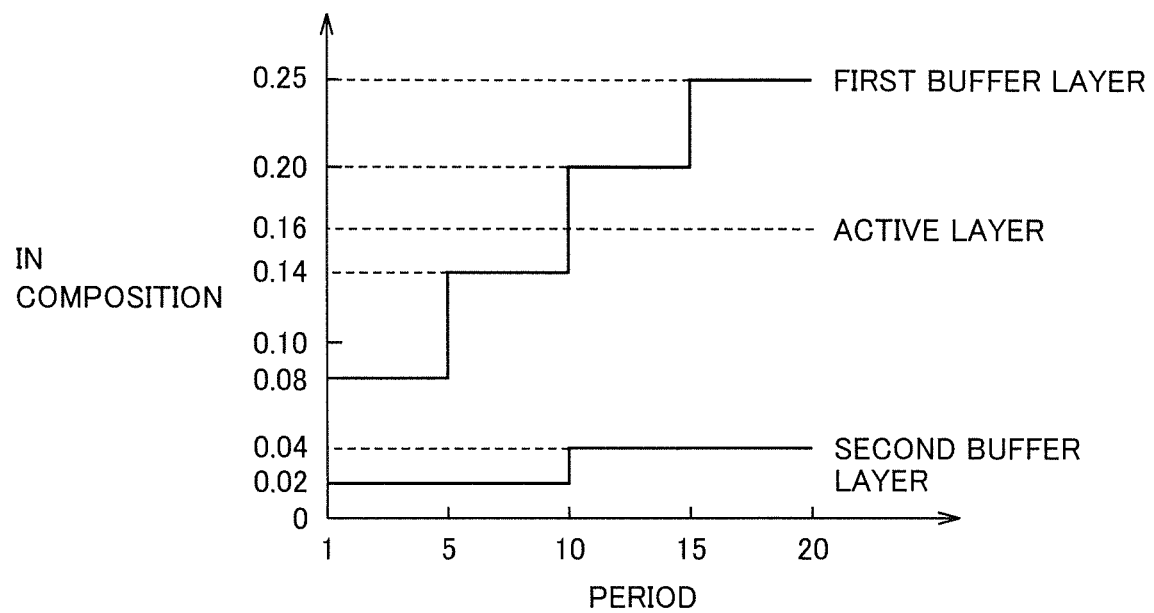
FIG. 9 is a diagram showing changes of an In composition x1 of a first buffer layer and an In composition x2 of a second buffer layer in a crystal growth direction in a third embodiment.

FIG. 9 shows changes of the In composition x1 of first buffer layer 15a and the In composition x2 of second buffer layer 15b in the crystal growth direction in the third embodiment. As shown in FIG. 9, the In composition x2 of second buffer layer 15b in the third embodiment is 0.02 between 1st and 10th periods, and it is 0.04 between 11th and 20th periods. That is, according to buffer layer 15 in the third embodiment, the In composition x2 of second buffer layer 15b is increased in stages toward active layer 16 while satisfying that $x2 < x1$.

Herein, buffer layer 15 in the second embodiment can be formed by increasing a supply amount of TMI in accordance with the increase of the In composition x2 of second buffer layer 15b while second buffer layers 15b are crystal grown by the MOCVD method.

Thus, similar to the first and second embodiments, an LED element in the third embodiment is produced with a nitride semiconductor light-emitting element in the third embodiment.

Thus, the LED element in the third embodiment is evaluated, and it is confirmed that an emission wavelength and a light output of the LED element in the third embodiment at a drive current of 20 mA are 447 nm and 46 mW, respectively, and a light output at a drive current of 60 mA is 75 mW (about 1.6 times compared with that at 20 mA). Meanwhile, as described above, the light outputs of the LED element in the comparison example 1 having the conventional structure at the drive currents of 20 mA and 60 mA are 35 mW and 46 mW (about 1.3 times as compared with that at 20 mA), respectively.

Herein, as for buffer layer 15 in the third embodiment, when the In composition x1 of first buffer layer 15a is linearly increased toward active layer 16, the same effect as the LED element in the third embodiment can be also obtained.

In addition, as for buffer layer 15 in the third embodiment, when the In composition x1 of first buffer layer 15a is increased in an exponential manner toward active layer 16, the same effect as that of the LED element in the third embodiment can be obtained.

Furthermore, as for buffer layer 15 in the third embodiment, when the In composition x1 of first buffer layer 15a is increased continuously or in stages toward active layer 16, and the In composition x2 of second buffer layer 15b is increased linearly or in an exponential manner toward active layer 16, the same effect as that of the LED element in the third embodiment can be obtained.

It is considered that the above effect can be obtained because by increasing the In composition x1 of first buffer layer 15a in buffer layer 15 continuously or in stages toward active layer 16, making the In composition x1 of first buffer layer 15a arranged closest to active layer 16, higher than the In composition of the InGaN quantum well layer of active layer 16, and increasing the In composition x2 of second buffer layer 15b continuously or in stages toward active layer 16, the lattice relaxation of buffer layer 15 is facilitated and the defect of active layer 16 is reduced, whereby the internal quantum efficiency of the nitride semiconductor light-emitting element in the third embodiment is improved.

Herein, a description other than the above in the third embodiment is the same as those of the first and second embodiments, so that the description is omitted.

Fourth Embodiment

Figure 10:
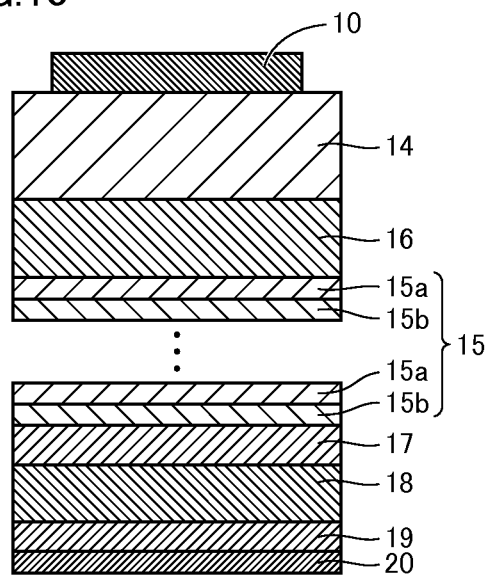
FIG. 10 is a schematic cross-sectional view of a nitride semiconductor light-emitting element in a fourth embodiment.

FIG. 10 shows a schematic cross-sectional view of a nitride semiconductor light-emitting element in a fourth embodiment. The fourth embodiment is characterized in that the p-type nitride semiconductor layer, buffer layer 15, active layer 16, and the n-type nitride semiconductor layer are grown on substrate 11 in this order, whereby the nitride semiconductor light-emitting element is produced.

Figure 11:
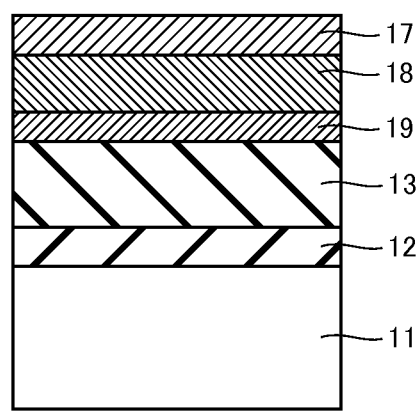
FIG. 11 is a schematic cross-sectional view illustrating one part of production steps in one example of the method for producing the nitride semiconductor light-emitting element in the fourth embodiment.

With reference to the schematic cross-sectional views in FIGS. 11 to 15, a description will be given below of one example of a method for producing the nitride semiconductor light-emitting element in the fourth embodiment. First, as shown in FIG. 11, low-temperature buffer layer 12 is formed on the surface of substrate 11, undoped GaN layer 13 is laminated on low-temperature buffer layer 12, p-type GaN contact layer 19 is laminated on undoped GaN layer 13, p-type GaN layer 18 is laminated on p-type GaN contact layer 19, and carrier barrier layer 17 is laminated on p-type GaN layer 18.

Figure 12:
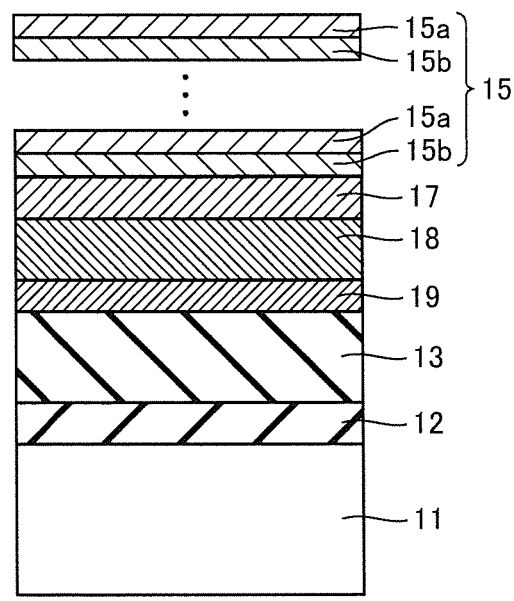
FIG. 12 is a schematic cross-sectional view illustrating another part of the production steps in the one example of the method for producing the nitride semiconductor light-emitting element in the fourth embodiment.

Then, as shown in FIG. 12, second buffer layer 15b expressed by the equation of $In_{x2}Ga_{1-x2}N$ ($0 \leq x2 < 1$, $x2 < x1$) and first buffer layer 15a expressed by the equation of $In_{x1}Ga_{1-x1}N$ ($0 < x1 \leq 1$) are alternately laminated, whereby buffer layer 15 is laminated on carrier barrier layer 17.

According to the fourth embodiment, buffer layer 15 is the undoped layer, but a p-type impurity such as Mg may be doped so that buffer layer 15 becomes a p type, for example. In this case, the p-type impurity such as Mg can be doped in one or both of first buffer layer 15a and second buffer layer 15b. In addition, in the case where the p-type impurity such as Mg is doped in buffer layer 15, it is preferable to dope the p-type impurity such as Mg into buffer layer 15 so that a Mg density shows a value appropriate to a carrier density of p-type GaN layer 18.

Therefore, in the case where the p-type impurity such as Mg is doped into only one of first buffer layer 15a and second buffer layer 15b, in view of the fact that the buffer layer which is not doped with the p-type impurity is the undoped layer, it is preferable to adjust a doping amount of the p-type impurity such as Mg so that buffer layer 15 reaches a desired carrier density.

However, as for $In_{x1}Ga_{1-x1}N$ ($0 < x1 \leq 1$) and $In_{x2}Ga_{1-x2}N$ ($0 \leq x2 < 1$, $x2 < x1$), even when they are undoped, they tend to show a weak n type, so that when the p-type impurity such as Mg is doped into buffer layer 15, it is more preferable to dope the p-type impurity such as Mg into each of first buffer layer 15a and second buffer layer 15b.

Figure 13:
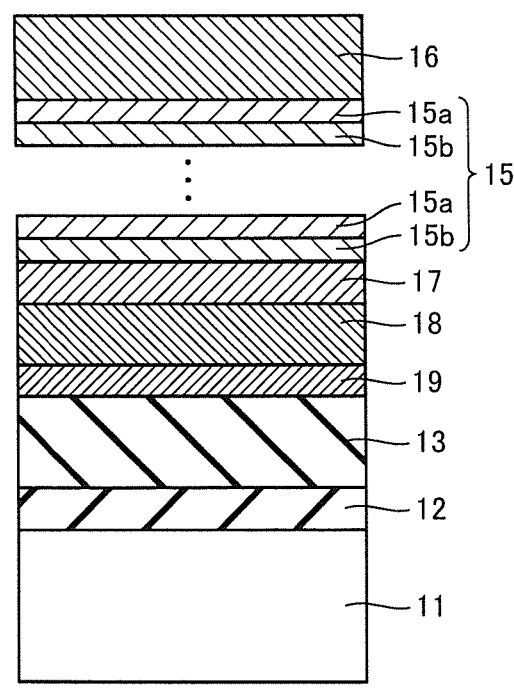
FIG. 13 is a schematic cross-sectional view illustrating another part of the production steps in the one example of the method for producing the nitride semiconductor light-emitting element in the fourth embodiment.
Figure 14:
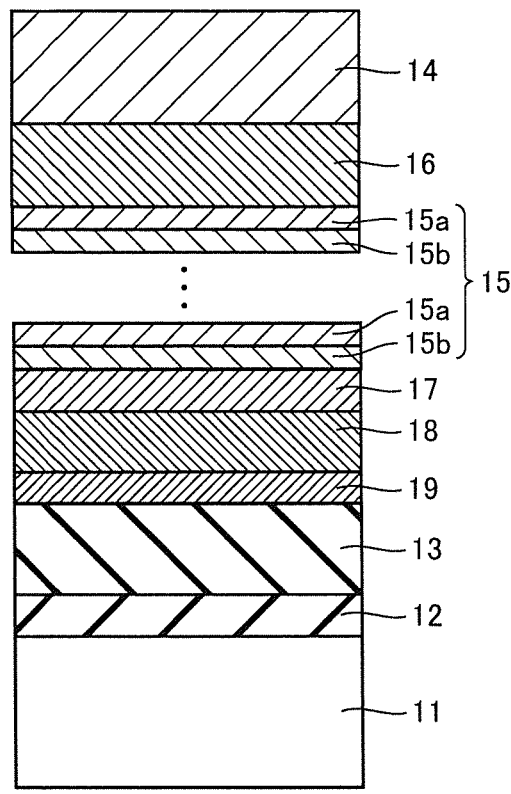
FIG. 14 is a schematic cross-sectional view illustrating another part of the production steps in the one example of the method for producing the nitride semiconductor light-emitting element in the fourth embodiment.

Then, as shown in FIG. 13, active layer 16 is laminated on buffer layer 15, and n-type GaN layer 14 is laminated on active layer 16 as shown in FIG. 14.

Figure 15:
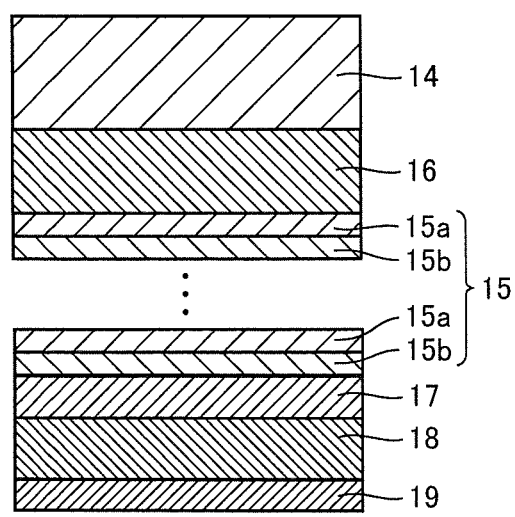
FIG. 15 is a schematic cross-sectional view illustrating another part of the production steps in the one example of the method for producing the nitride semiconductor light-emitting element in the fourth embodiment.

Then, as shown in FIG. 15, substrate 11 is peeled off, and low-temperature buffer layer 12 and undoped GaN layer 13 are removed by polishing, whereby a back surface of p-type GaN contact layer 19 is exposed.

Then, as shown in FIG. 10, n electrode 10 and p electrode 20 are formed on the surface of n-type GaN layer 14 and the back surface of p-type contact layer 19, respectively, and a heat treatment is performed for alloying, and divided into chips through a normal dicing step. Thus, the nitride semiconductor light-emitting element in the fourth embodiment is produced as shown in FIG. 10.

Then, similar to the first to third embodiments, an LED element in the fourth embodiment is produced with the nitride semiconductor light-emitting element in the fourth embodiment.

Thus, the LED element in the fourth embodiment is evaluated, and it is found that an emission wavelength and a light output of the LED element in the fourth embodiment at a drive current of 20 mA are 445 nm and 35 mW, respectively, and a light output at a drive current of 60 mA is 56 mW (about 1.6 times compared with that at 20 mA).

For comparison, an LED element in a comparison example 2 is produced in the same way as that in the fourth embodiment except that instead of first buffer layer 15a of buffer layer 15 described in this embodiment, a first buffer layer expressed by an equation of $In_{0.08}Ga_{0.92}N$ having an In composition lower than that of the InGaN quantum well layer of active layer 16 and a second buffer layer composed of GaN are alternately laminated to form a strained superlattice layer. According to the LED element in the comparison example 2, the In composition of the first buffer layer is lower than that of the InGaN quantum well layer of the active layer, so that the buffer layer does not perform the lattice relaxation. In addition, the LED element in the comparison example 2 is formed such that an active layer composed of MQW is coherently grown on the strained superlattice layer.

Light outputs of the LED element in the comparison example 2 at drive currents of 20 mA and 60 mA are 25 mW and 34 mW (about 1.4 times compared with that at 20 mA), respectively.

Thus, even when the p-type nitride semiconductor layer, buffer layer 15, active layer 16, and the n-type nitride semiconductor layer are crystal grown on substrate 11 in this order, internal quantum efficiency of the nitride semiconductor light-emitting element in the fourth embodiment having buffer layer 15 is improved, and as a result, the light output of the LED element in the fourth embodiment is improved, compared with the LED element in the comparison example 2.

Herein, a description except for the above in the fourth embodiment is the same as those in the first to third embodiments, so that the description is omitted.

Fifth Embodiment

According to a fifth embodiment, the sample provided by laminating the layers up to active layer 16 on the C face of the sapphire substrate serving as one example of the heterogeneous substrate in each of the first and second embodiments is taken out of the MOCVD apparatus and a defect density of active layer 16 is evaluated. A method for evaluating the defect density includes a method for counting the number of pits generated after active layer 16 is etched with a specific solution, and a method for counting dark spots of a CL (cathodoluminescence) image. Note that, the "heterogeneous substrate" in this specification means a substrate composed of a material which is different from the nitride semiconductor crystal expressed by the equation of $Al_\alpha In_\beta Ga_\gamma N$ ($0 \leq \alpha \leq 1$, $0 \leq \beta \leq 1$, $0 \leq \gamma \leq 1$, $\alpha + \beta + \gamma \neq 0$).

First, a description will be given of the method for counting the number of pits generated after active layer 16 is etched with the specific solution. It is known that the nitride semiconductor crystal is extremely high in resistance to a chemical due to strong interatomic bonds provided by strong ionicity of nitrogen serving as a component, compared with a non-nitride semiconductor crystal such as GaAs or GaP, but has solubility to the specific solution.

The nitride semiconductor crystal has a certain level of solubility to a solution provided by heating up a phosphoric acid-sulfuric acid mixture mixed at a given rate to about greater than or equal to 200° C. or molten KOH. In addition, it is confirmed that as the defect density of the nitride semiconductor crystal becomes high, a soluble degree of the nitride semiconductor crystal to those solutions becomes high. This is because a chemical reaction proceeds by bonds between a defect-induced electric charge and an ion in the solution.

Therefore, the dissolution rate of the nitride semiconductor crystal differs depending on the level of the defect density, and a periphery of the defect of the nitride semiconductor crystal is selectively solved, whereby the pits are formed. The density of the pits is roughly equal to the defect density, so that the defect density can be evaluated by this method.

In addition, by adjusting the concentration or temperature of the solution, for example, a shape of the pit can be changed depending on a kind of the defect, and the kind of the defect and its density can be individually evaluated. According to this embodiment, as the defect, the mixed dislocation and the screw dislocation are selected and evaluated.

A density of the pits generated on the surface of the sample in the first embodiment after etched with the specific solution is $1 \times 10^7/cm^2$. In addition, a density of the pits generated on the surface of the sample in the comparison example 1 using the strained superlattice layer having the structure X, instead of buffer layer 15 of the sample in the first embodiment is $1\times10^8$ to $1\times10^9/cm^2$.

Therefore, the density of the pits can be reduced in active layer 16 in the first embodiment, compared with the active layer in the comparison example 1.

Similar to the first embodiment, a density of the pits generated on the surface of the sample in the second embodiment is $0.8\times10^7/cm^2$, so that the defect density can be further reduced than the first embodiment.

In a case where the superlattice layer number is the same, when a composition of the quantum well layer (first buffer layer 15a) is changed, the lattice mismatch rate with the barrier layer (second buffer layer 15b) is increased and contributes to the lattice relaxation, so that the lattice constant in the plane comes close to the value of the bulk having the high composition.

In addition, when misfit dislocation caused by the lattice relaxation receives a stress in the vicinity of the interface between the barrier layer and the quantum well layer while transferring in the growth direction of buffer layer 15, it changes its transferring direction to a lateral direction, forms a dislocation loop, and disappears.

It is considered that these effects are provided more apparently in the second embodiment than the first embodiment, and lead to the reduction in pit density. This result corresponds to an increase in emission intensity of the nitride semiconductor light-emitting element.

Then, the CL image is observed to evaluate the density of the dark spots in the sample in each of the first embodiment and the second embodiment. In general, it is known that the defect in the crystal captures the injected carrier, and serves as the non-radiative recombination center. Therefore, it can be said that the dark spots appearing in the CL image correspond to the defect.

As a result of observing the CL image of the sample in each of the first embodiment and the second embodiment and finding the density of the dark spots, it is found that the result roughly coincides with the density of the pits provided by the solution treatment. Thus, the results obtained by the different methods coincide with each other, so that it is confirmed that according to the present invention, the defect density of active layer 16 is reduced to less than or equal to $1\times10^7/cm^2$.

In addition, a description in the fifth embodiment except for the above is the same as those in the first to fourth embodiments, so that the description is omitted.

Sixth Embodiment

A sixth embodiment is characterized in that the nitride semiconductor layer is not laminated on the C face of the sapphire substrate, but the nitride semiconductor layer is laminated on an R face of the sapphire substrate.

Except that the nitride semiconductor layer is laminated on the R face of the sapphire substrate, a nitride semiconductor light-emitting element is produced in the sixth embodiment similarly to the first embodiment. Then, an LED element of the sixth embodiment is produced with the nitride semiconductor light-emitting element in the sixth embodiment, similarly to the first embodiment.

Thus, the LED element of the sixth embodiment is evaluated, and it is found that an emission wavelength and a light output of the LED element in the sixth embodiment at a drive current of 20 mA are 445 nm and 20 mW, respectively, and a light output at a drive current of 60 mA is 34 mW (about 1.7 times compared with that at 20 mA).

For comparison, an LED element in a comparison example 3 is produced in the same way as that in the sixth embodiment except that instead of first buffer layer 15a of buffer layer 15 described in this embodiment, a first buffer layer expressed by an equation of $In_{0.08}Ga_{0.92}N$ having an In composition lower than that of the InGaN quantum well layer of active layer 16 and a second buffer layer composed of GaN are alternately laminated to form a strained superlattice layer. According to the LED element in the comparison example 3, the In composition of the first buffer layer is lower than that of the InGaN quantum well layer of active layer 16, so that the buffer layer does not perform the lattice relaxation. In addition, the LED element in the comparison example 3 is formed such that an active layer composed of MQW is coherently grown on the strained superlattice layer.

Light outputs of the LED element in the comparison example 3 at drive currents of 20 mA and 60 mA are 14 mW and 18 mW (about 1.3 times compared with that at 20 mA), respectively.

This result shows that, as considered in the second embodiment, the lattice constant modulation due to the lattice relaxation of buffer layer 15 is essential, and by modulating the lattice constant, the element characteristics can be improved almost regardless of a plane direction of the substrate.

In addition, a description in the sixth embodiment except for the above is the same as those in the first to fifth embodiments, so that the description is omitted.

Seventh Embodiment

A seventh embodiment is characterized in that the nitride semiconductor layer is not laminated on the C face of the sapphire substrate, but the nitride semiconductor layer is laminated on an R face of a GaN substrate.

Except that the nitride semiconductor layer is laminated on the R face of the GaN substrate, the nitride semiconductor light-emitting element is produced in the seventh embodiment similarly to the first embodiment. Then, an LED element of the seventh embodiment is produced with a nitride semiconductor light-emitting element in the seventh embodiment, similarly to the first embodiment.

Thus, the LED element of the seventh embodiment is evaluated, and it is found that an emission wavelength and a light output of the LED element in the seventh embodiment at a drive current 20 mA are 445 nm and 47 mW, respectively, and a light output at a drive current 60 mA is 75 mW (about 1.6 times compared with that at 20 mA).

For comparison, an LED element in a comparison example 4 is produced in the same way as that in the seventh embodiment except that instead of first buffer layer 15a of buffer layer 15 described in this embodiment, a first buffer layer expressed by an equation of $In_{0.08}Ga_{0.92}N$ having an In composition lower than that of the InGaN quantum well layer of the active layer and a second buffer layer composed of GaN are alternately laminated to form a strained superlattice layer. According to the LED element in the comparison example 4, the In composition of the first buffer layer is lower than that of the InGaN quantum well layer of the active layer, so that the buffer layer does not perform the lattice relaxation. In addition, the LED element in the comparison example 4 is formed such that the active layer composed of MQW is coherently grown on the strained superlattice layer.

Light outputs of the LED element in the comparison example 4 at drive currents of 20 mA and 60 mA are 39 mW and 60 mW (about 1.5 times compared with that at 20 mA), respectively.

This result shows that, as considered in the second embodiment, the lattice constant modulation due to the lattice relaxation of buffer layer 15 is essential, and by modulating the lattice constant, the element characteristics can be improved almost regardless of a plane direction of the substrate.

Herein, a description in the seventh embodiment except for the above is the same as those in the first to sixth embodiments, so that the description is omitted.

The present invention can be applied to a nitride semiconductor light-emitting element having not only a blue region but also a long wavelength region such as green having a difficulty in crystal growth, so that industrial applicability is high.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A nitride semiconductor light-emitting element comprising:
    a substrate;
    an n-type nitride semiconductor layer and a p-type nitride semiconductor layer provided on said substrate; and
    a buffer layer and an active layer provided between said n-type nitride semiconductor layer and said p-type nitride semiconductor layer, wherein
    said buffer layer has plural first buffer layers, each of which is independently expressed by an equation of $In_{x1}Ga_{1-x1}N$ ($0<x1\leq1$) and plural second buffer layers, each of which is independently expressed by an equation of $In_{x2}Ga_{1-x2}N$ ($0\leq x2<1$, $x2<x1$), said buffer layer including a superlattice structure in which said first buffer layer and said second buffer layer are alternately laminated,
    In compositions x1 of said plural first buffer layers are changed in said buffer layer,
    the In composition x1 of at least one layer of said plural first buffer layers is lower than an In composition of said active layer,
    the In composition x1 of at least one other layer of said plural first buffer layers is higher than an In composition of said active layer, and
    an effective bandgap of said buffer layer, in a region that the In composition x1 of at least one layer of said plural first buffer layers is higher than an In composition of said active layer, is larger than an effective bandgap of said active layer.

2. The nitride semiconductor light-emitting element according to claim 1, wherein
    the In compositions x1 of said plural first buffer layers are increased continuously or in stages in said buffer layer toward said active layer, and
    the In composition x1 of said first buffer layer arranged closest to said active layer is higher than the In composition of said active layer.

3. The nitride semiconductor light-emitting element according to claim 2, wherein
    in said buffer layer, In compositions x2 of said plural second buffer layers are constant in a range satisfying that $0\leq x2<x1$, or increased under a condition that $x2<x1$ toward said active layer.

4. The nitride semiconductor light-emitting element according to claim 1, wherein
    said substrate comprises $Al_xIn_yGa_{1-x-y}N$ ($0\leq x\leq1$, $0\leq y\leq1$, $0<x+y\leq1$), GaP, GaAs, $NdGaO_3$, $LiGaO_2$, $Al_2O_3$, $MgAl_2O_4$, ZnO, SiC, SiGe, or $ZrB_2$.

5. The nitride semiconductor light-emitting element according to claim 1, wherein
    a surface of said substrate is a polar face, semi-polar face, or no-polar face.

6. The nitride semiconductor light-emitting element according to claim 1, wherein
    said substrate is a heterogeneous substrate, and
    a defect density in said active layer is less than or equal to $1\times10^7/cm^2$.

7. A method for producing the nitride semiconductor light-emitting element according to claim 1, including the steps of:
    laminating said n-type nitride semiconductor layer on said substrate;
    laminating said buffer layer on said n-type nitride semiconductor layer;
    laminating said active layer on said buffer layer, and
    laminating said p-type nitride semiconductor layer on said active layer.

8. The method for producing a nitride semiconductor light-emitting element according to claim 1, including the steps of:
    laminating said p-type nitride semiconductor layer on said substrate;
    laminating said buffer layer on said p-type nitride semiconductor layer;
    laminating said active layer on said buffer layer, and
    laminating said n-type nitride semiconductor layer on said active layer.

9. The nitride semiconductor light-emitting element according to claim 1, wherein
    said buffer layer contains a first period and a second period in each of which said first buffer layers and said second buffer layers are alternately laminated one by one, In compositions x1 of said first buffer layers in said first period being lower than the In composition of said active layer, and In compositions x1 of said first buffer layers in said second period being higher than the In composition of said active layer, said first period and said second period being alternately laminated.

10. The nitride semiconductor light-emitting element according to claim 1, wherein
    said buffer layer contains a first period, a second period, a third period and a fourth period in each of which said first buffer layers and said second buffer layers are alternately laminated one by one, In compositions x1 of said first buffer layers in said first period and said second period being lower than the In composition of said active layer, and In compositions x1 of said first buffer layers in said third period and said fourth period being higher than the In composition of said active layer, In compositions x1 of said first buffer layers in said first period being lower than In compositions x1 of said first buffer layers in said second period, In compositions x1 of said first buffer layers in said third period being lower than In compositions x1 of said first buffer layers in said fourth period, and said first period, said second period, said third period and said fourth period being laminated in this order.

11. The nitride semiconductor light-emitting element according to claim 10, wherein In compositions x2 of said second buffer layers in said first period and said second period being lower than In compositions x2 of said second buffer layers in said third period and said fourth period.

* * * * *